United States Patent [19]

Piazza

[11] 4,243,700
[45] Jan. 6, 1981

[54] METHOD OF RENDERING AN INK STRIPPABLE

[75] Inventor: John R. Piazza, East Amwell Township, Hunterdon County, N.J.

[73] Assignee: Western Electric Company, Inc., New York, N.Y.

[21] Appl. No.: 18,378

[22] Filed: Mar. 7, 1979

Related U.S. Application Data

[62] Division of Ser. No. 879,324, Feb. 21, 1978, Pat. No. 4,157,936.

[51] Int. Cl.$^3$ .......................... B05D 3/12; B05D 1/36
[52] U.S. Cl. ................................ 427/195; 156/659.1; 156/668; 427/96; 427/154; 427/156; 427/197; 427/202; 427/259; 427/336
[58] Field of Search ............... 427/154, 155, 156, 195, 427/197, 202, 259, 336, 256, 96; 156/659, 668

[56] References Cited

U.S. PATENT DOCUMENTS

| | | | |
|---|---|---|---|
| 2,602,731 | 7/1952 | Nierenberg | 156/656 X |
| 3,320,657 | 5/1967 | Strobel | 156/659 X |
| 3,440,076 | 4/1969 | Vaurio | 427/195 |
| 3,444,809 | 5/1969 | Ohkubo et al. | 427/197 X |
| 3,628,999 | 12/1971 | Schneble et al. | 427/98 X |
| 3,666,549 | 5/1972 | Rhodenizer et al. | 427/336 X |
| 3,911,160 | 10/1975 | Neuberg | 427/27 X |
| 4,001,466 | 1/1977 | Shaul et al. | 427/96 |

OTHER PUBLICATIONS

Encyclopedia of Chemical Technology, Kirk and Othmer, Editors, 2nd Edition, vol. 11, 1966, pp. 248–250.
Hercules Inc. Product Data entitled "Piccopale ® 100 Resins" No. 7183–3.

*Primary Examiner*—Shrive P. Beck
*Attorney, Agent, or Firm*—J. F. Spivak

[57] ABSTRACT

A method of rendering an ink, selected from the group consisting of an oil-modified alkyd ink and a drying oil ink, strippable from a surface, upon which it is applied and dried, is disclosed. The method comprises applying to the printed ink, prior to the drying thereof, a modifying powder comprising a petroleum resin.

12 Claims, No Drawings

METHOD OF RENDERING AN INK STRIPPABLE

This is a division of application Ser. No. 879,324 filed Feb. 21, 1978 now U.S. Pat. No. 4,157,936.

BACKGROUND OF THE INVENTION

1. Field of the Invention

This invention relates to a method of rendering an ink strippable and more particularly, to rendering a pattern of an oil-modified alkyd ink or a drying oil vehicle ink strippable from a surface upon which it is applied and dried.

2. Discussion of the Prior Art

A method for fabricating printed wiring boards involves the so-called "subtractive" technique. In the subtractive technique a laminate comprising metal sheets or laminae, e.g., copper laminae, adherently deposited or held on opposed surfaces of a dielectric substrate is selected for treatment. At least one of the metal laminae is selectively coated with an etch resistant material to form a masking pattern. The resultant masked surface is then subjected to an etchant whereby the unmasked portions of the metal layer are removed by etching. The masking pattern is then removed to yield a conductive pattern remaining on the dielectric substrate.

In practice, the etch resistant material typically comprises a photoresist which has to be initially selectively exposed to a source of light energy, followed by solvent development to form the masking pattern. Utilizing such a photoresist material is both time consuming and expensive. Alternatively, etch-resistant inks with solvent vehicles have been utilized as masking materials. These inks are screen printed on the metal surface and then dried by heating the surface and driving off the solvents employed. The problems with using such materials are that screen printing is a slower process than other printing techniques, such as offset printing, line widths under 20 mils are generally not feasible and also pollution is involved whenever solvents have to be driven off from an applied ink.

Offset printing techniques have been utilized to form the masking pattern. However, difficulties are encountered in finding inks which are both suitable for printing techniques, such as offset printing, and which can be easily or practically removed from the metal surface after serving as an etch resist. Oftentimes the ink or resist pattern cannot be easily removed, as by treatment with a solvent, and must be removed by such expedients as mechanical grinding. U.S. Pat. No. 2,602,731 reveals such an expedient.

A group of inks which are suitable for offset printing comprises resins which are known as oil-modified alkyd resins. An oil-modified alkyd resin comprises the reaction product of a dibasic (difunctional) acid or acid anhydride, e.g., phthalic anhydride, a polyol, e.g., glycerin, and a drying oil fatty acid, e.g., levulinic acid. Another group of inks which are suitable for offset printing comprises resins or vehicles known as drying oils. These inks are formulated and manufactured from such typical oils as linseed, tung, soybean, safflower, dehydrated castor, poppyseed, oiticia and perilla oils. Both groups of inks, upon drying, that is upon polymerizing and/or crosslinking, form a film which resists scuffing and abrasion and because of this, find wide utility in decorating metal surfaces. However, these alkyd containing and drying oil containing inks, upon drying, and nearly impossible to remove by solvent stripping. Such alkyd resin and drying oil containing inks are not therefore being used for offset printing etch resist patterns in subtractive fabrication of printed wiring boards.

A method of rendering an oil-modified alkyd resin ink pattern and a drying oil vehicle ink pattern capable of being readily solvent stripped from a surface to which it is applied is needed and is desired, especially for offset printing of resist patterns in subtractive printed wiring board manufacture.

SUMMARY OF THE INVENTION

This invention relates to a method of rendering an ink strippable and more particularly, to rendering a pattern of an oil-modified alkyd ink or a drying oil vehicle ink strippable from a surface upon which it is applied and dried. The method comprises applying to the ink, prior to the drying thereof, a modifying powder comprising a petroleum resin.

DETAILED DESCRIPTION

The present invention will be discussed primarily in terms of solvent stripping a dry offset printed ink pattern, comprising an oil-modified alkyd resin or a drying oil ink, from a metallic copper surface. It will be readily appreciated that the inventive concept is equally applicable to stripping the drying oil or alkyd ink from other surfaces, metallic or non-metallic, which are chemically compatible with the ink and with the solvent employed to strip the ink. It will also be appreciated that the ink may be printed either in a blanket fashion (not in a pattern) to cover the surface or in a pattern using any conventional printing technique such as lithography or wet offset, dry offset or letterset, letterpress and intaglio printing techniques, as well as brushing and stenciling techniques.

It has now been discovered that solvent-free printing inks comprising an oil-modified alkyd resin or a drying oil can be rendered solvent strippable from a surface upon which such inks are applied and dried. Thus, in accordance with the present invention, a solvent-free ink comprising an oil modified alkyd resin or a drying oil is selected. Oil modified alkyd resin containing inks are well known in the printing art as described in "PRINTING AND LITHO INKS," Herbert Jay Wolfe, Sixth Edition, 1967, published by MacNair-Dorland Company, New York City. Typically an oil-modified alkyd resin is the reaction product of (1) a multifunctional acid or acid anhydride, (2) a multifunctional polyol and (3) a monofunctional (monobasic) drying oil fatty acid or monoglyceride. Some suitable multifunctional acids or anhydrides include ortho, meta, and para-phthalic acids and anhydrides, succinic, adipic and sebacic acids. Some suitable polyols include glycerine, neopentyl glycol, trimethylol-ethane and trimetholol-propane. Some suitable drying oil fatty acids include linoleic, licanic and eleostearic acids.

Drying oil or drying oil vehicle containing inks are also well known in the printing art as also described in *Printing and Litho Inks,* Herbert Jay Wolfe. Typically, these inks are manufactured from linseed, tung, soybean, safflower, dehydrated castor, poppyseed, oiticia and perilla oils.

Selected is a metal clad laminate of a dielectric base, e.g., a copper clad laminate of a thermosetting of thermoplastic resin base, the sheet or film of metal being bonded to it by heat and pressure in the manner conventionally employed in preparing blank circuit boards for use in subtractive processing of printed circt boards. The laminate is then oriented in an offset printing press, typically by locating pins of the press entering indexing holes in the laminate. An oil-modified alkyd ink pattern or a drying oil ink pattern, corresponding to a desired circuit pattern, is then offset printed on a metal lamina or surface of the laminate, to thereby delineate an uninked pattern comprising the uncoated metal portions. The uninked pattern is destined to be etched and thereby removed from the laminate.

After the printed pattern is transferred to the metal surface, and while the ink is wet or tacky, i.e., has not polymerized or crosslinked to a hardened, non-flowing mass, a modifying powder is dusted or applied in any conventional manner to the inked surface. The modifying powder adheres only to the wet and tacky printed image and the excess thereof is removed, as for example by being blown away by a pressurized gas, removed by vacuum, or otherwise removed. The resultant powdered surface is then heated employing any conventional means and technique, e.g., use of heat lamps, ovens, etc., to fuse the modifying powder and the inked pattern to the metal surface to form an etch resist pattern thereon which can be solvent stripped therefrom.

A suitable modifying powder is one which is resistant to the etchant destined to be employed to etch metal portions of the laminate and which is capable of rendering the oil-modified ink or drying oil ink pattern solvent strippable from the metal surface after it has been fused or dried thereupon. A suitable modifying powder comprises a petroleum resin which is a low molecular weight hydrocarbon resin, usually below 2000 in average molecular weight, typically having a softening point between 100° and 120° C., which is made, not from one chemical, but from a blend of many. The petroleum resin is derived by the catalytic polymerization of deeply cracked petroleum stocks. Petroleum resins, their properties and commercial availability, are described in *Encyclopedia of Chemical Technology*, Raymond E. Kirk and Donald F. Othmer, Editors, Second Edition, Volume 11, at pages 248 through 250, published by Interscience Publishers, New York, 1966. Suitable commercial petroleum resins which are available are the "PICCOPALE" resins, such as for example "PICCOPALE 100, 100 BHT, 100 SF and 100 HM" resins available from Hercules Incorporated, Wilmington, Delaware. Such resins are high softening point members of a series of low molecular weight, aliphatic hydrocarbon resins derived mainly from a five carbon containing diolefin.

The amount of modifying powder employed should be sufficient to yield a dried or fused resist pattern having a thickness of at least two times the original thickness of the wet or tacky ink pattern. Also, the resultant powdered surface should be heated at a temperature and for a period of time sufficient to fuse the modifying powder to form a powder coat over the inked pattern. It is to be noted and stressed hereat that the modifying powder cannot be added to the oil-modified alkyd ink or drying oil ink prior to the printing thereof. If such is done, then the resultant printed pattern cannot be readily solvent stripped from the surface upon which it is applied and dried. The modifying powder must be applied to the surface of the wet or tacky inked pattern and then heated to form a coat thereover. It is hypothesized that the modifying powder cost acts as a mask which prevents the oil-modified alkyd ink or the drying oil ink from adequately reacting with oxygen which results in extensive crosslinking and thus the inability to be solvent stripped. However, this is a hypothesis only and the invention disclosed herein is not to be limited thereby. Exemplary, the powdered surface is heated at a temperature of 125° C. to 150° C. for 5 to 10 minutes when a modifying powder is employed having a softening point of 100° C. to 175° C.

After the powdered surface is heated to form the resist pattern, etching thereof is then carried out in a conventional manner. Typically, for copper metal, the resultant resist patterned laminate is treated, e.g., by spraying, with a solution comprising ferric chloride, whereby the uninked or exposed metal pattern is etched and removed from the laminate. The metal portions underlying the resist pattern are protected from the etchant and thus are retained.

Typically, the etched laminate is rinsed in water, neutralized, e.g., in sodium bicarbonate when $FeCl_3$ is the etchant, and again rinsed in water. The resultant laminate is then treated, as by immersion, with a suitable solvent for the modifying powder coated inked pattern. A suitable solvent is one which will dissolve or strip the dried, modifying powder coated ink pattern from the surface to which it is applied without reacting with such a surface. Some typical suitable solvents include chlorinated hydrocarbons, such as methylene chloride, trichloroethane, trichloroethylene, etc.; and aromatic hydrocarbons such as toluene, xylene, etc. The laminate is treated with the solvent for a period of time sufficient to remove or strip the fused powder coated, oil-modified alkyd ink pattern from the metal surface underlying it to yield a printed circuit board having an uncoated or bared circuit pattern thereon.

EXAMPLE I

For comparison purposes a 154.8 cm.$^2$ surface of a 0.0035 cm. thick copper layer of a commercially obtained copper clad dielectric base laminate was offset printed in a pattern with an ink comprising a soybean oil-modified isophthalic-pentaerythritol alkyd resin having an oil content of 50 to 60 percent by weight, a viscosity of 1100 to 1300 poise at 77° F. and a maximum acid number of 15 (obtained from Superior Varnish and Drier Company and designated as "Soya Alkyd 3808"). The printed surface was then oven heated at 150° C. for 15 minutes to dry the inked pattern on the surface. The inked laminate was then passed through a conventional spray etcher using a copper metal etchant (commercially obtained and designated as "HUNT HI-SPEED CIRCUIT ETCH") at 85° F. to remove the uninked portions of the copper, thereby delineating an ink coated copper pattern on the dielectric of the laminate. After 14 days, the resultant etched laminate was then immersed in an ultrasonically agitated solvent bath comprising hot 50° C.) methyl chloroform. The inked pattern was not removed or stripped after one minute in the solvent bath.

EXAMPLE II

The procedure of EXAMPLE I was repeated except that after the inked pattern was printed on the surface, a modifying powder was applied by means of sprinkling thereon, while the ink was wet and tacky. The modifying powder comprised a commercially obtained petroleum resin comprising a low molecular weight aliphatic hydrocarbon resin derived mainly from a five carbon diolefin having a Ring and Ball softening point of about 97° to 103° C., a maximum acid number of about 1, a saponification number of less than 2, a bromine number of 45, a density of 0.97 kg/liter, a flash point of 259° C., and a melt viscosity of 1 poise at 230° C., 10 poises at 180° C. and 100 poises at 150° C. (available from Hercules Incorporated, Wilmington, Del. and designated as "PICCOPALE 100" resin).

The applied powder adhered to the wet ink pattern and the excess powder was removed from the printed copper surface by means of an air knife having pressurized air passing therethrough. The resultant powder deposited ink patterned surface was then oven heated at 150° C. for 15 minutes, fusing the powder to a glossy, continuous coat over the ink pattern. The laminate was then etched as in EXAMPLE I, and then after 14 days, immersed in the solvent bath of EXAMPLE I. After one minute at 50° C. in the solvent bath, the composite powder coated oil-modified alkyd ink pattern was completely removed.

EXAMPLE III

The procedure of EXAMPLE I was repeated except that an ink comprising a rosin-modified phenolic resin in treated linseed oil having a viscosity of 2150 to 2350 poises at 25° C. (obtained from Superior Varnish and Drier Company, designated as "No. 3961 Metal Decorating Varnish") was employed. The printed surface was oven heated at 150° C. for 10 minutes to dry the ink pattern on the surface. After 14 days, a portion of the ink pattern was flooded with methyl chloroform at 25° C. which solvent was permitted to dwell thereon for 20 seconds. The resultant wetted area of the ink pattern was rubbed with a paper towel in an attempt to remove that portion of the ink pattern. Except for a slight reduction of surface gloss the ink pattern was unaffected.

EXAMPLE IV

The procedure of EXAMPLE III was repeated except that after the inked pattern was printed on the surface the modifying powder of EXAMPLE II was applied thereto. After removing excess powder, the resultant powder-deposited ink pattern surface was then oven heated at 150° C. for 10 minutes, fusing the powder to a glossy, continuous coat over the ink pattern. After 14 days, a portion of the coated ink pattern was flooded with the methyl chloroform as in EXAMPLE III. After 20 seconds the flooded portion of the coated ink pattern was readily and completely wiped off using a paper towel.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A method of rendering an ink, selected from the group consisting of an oil-modified alkyd ink and a drying oil vehicle ink, strippable from a surface upon which it is applied, dried, and stripped which comprises:
   (a) applying the ink;
   (b) prior to the drying of the applied ink, applying thereto a modifying powder comprising a petroleum resin;
   (c) fusing said modifying powder which overlies said ink; and
   (d) stripping the resultant fused coat.

2. The method as defined in claim 1 wherein said oil-modified alkyd ink comprises a soybean oil-modified isophthalic pentaerithrytol alkyd.

3. The method as defined in claim 2 wherein said modifying powder comprises an aliphatic polymer resulting predominantly from a five carbon diolefin.

4. The method as defined in claim 1 wherein said drying oil vehicle ink comprises a linseed oil vehicle.

5. The method as defined in claim 4 wherein said modifying powder comprises an aliphatic polymer resulting predominantly from a five carbon diolefin.

6. A method of stripping a dried ink pattern from a surface, which comprises:
   (a) applying an ink pattern comprising an ink selected from the group consisting of an oil-modified alkyd ink and a drying oil ink to the surface of a substrate;
   (b) prior to the drying of said ink pattern, dusting thereon a modifying powder comprising a petroleum resin to form a powdered ink pattern;
   (c) heating said powdered ink pattern to fuse at least said dusted powder to form a modifying coat over the ink pattern; and
   (d) treating at least said modifying coat covered ink pattern with a suitable solvent to remove said modifying coat covered ink pattern.

7. The method as defined in claim 6 wherein said oil-modified alkyd ink comprises a soybean oil-modified isophthalic pentaerithrytol alkyd.

8. The method as defined in claim 7 wherein said modifying powder comprises an aliphatic polymer resulting predominantly from a five carbon diolefin.

9. The method as defined in claim 6 wherein said drying oil vehicle ink comprises a linseed oil vehicle.

10. The method as defined in claim 9 wherein said modifying powder comprises an aliphatic polymer resulting predominantly from a five carbon diolefin.

11. A method of rendering an ink, selected from the group consisting of an oil-modified alkyd ink and a drying oil vehicle ink, wherein said oil-modified alkyd ink comprises a soybean oil-modified isophthalic pentaerythritol alkyd ink, strippable from a surface upon which it is applied and dried, which comprises:
   prior to the drying of the applied ink, applying thereto a modifying powder comprising an aliphatic polymer resulting predominantly from a five carbon diolefin.

12. A method of rendering an ink, selected from the group consisting of an oil-modified alkyd ink and a drying oil vehicle ink, wherein said drying oil vehicle comprises a linseed oil vehicle, strippable from a surface upon which it is applied and dried, which comprises:
   prior to the drying of the applied ink, applying thereto a modifying powder comprising an aliphatic polymer resulting predominantly from a five carbon diolefin.

* * * * *